United States Patent
Neidorff et al.

(10) Patent No.: US 11,984,876 B2
(45) Date of Patent: May 14, 2024

(54) TEMPERATURE-SENSITIVE SAMPLING (71) Applicant: TEXAS INSTRUMENTS INCORPORATED, Dallas, TX (US)

(72) Inventors: Robert Allan Neidorff, Bedford, NH (US); Robert Kenneth Oppen, Phoenix, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/732,986

(22) Filed: Apr. 29, 2022

(65) Prior Publication Data
US 2023/0353137 A1  Nov. 2, 2023

(51) Int. Cl.
*H03K 17/0812*  (2006.01)
*G01K 7/00*  (2006.01)
*G01R 19/10*  (2006.01)
*H03K 17/08*  (2006.01)

(52) U.S. Cl.
CPC ........... *H03K 17/0812* (2013.01); *G01K 7/00* (2013.01); *G01R 19/10* (2013.01); *H03K 2017/0806* (2013.01)

(58) Field of Classification Search
CPC ........... H03K 17/08; H03K 2017/0806; H03K 17/0812; H03K 17/08122; H03K 17/08124; H03K 17/08126; H03K 17/08128; H03K 17/081; H03K 17/08104; H03K 17/08108; H03K 17/08112; H03K 17/08116; G01R 19/00; G01R 19/10
See application file for complete search history.

(56) References Cited

U.S. PATENT DOCUMENTS

| | | | | |
|---|---|---|---|---|
| 7,531,998 B2 * | 5/2009 | Kim | ........................... | G05F 3/30 323/907 |
| 7,868,773 B2 * | 1/2011 | Honda | ................... | H03K 17/18 340/593 |

* cited by examiner

*Primary Examiner* — Diana J. Cheng
(74) *Attorney, Agent, or Firm* — Ray A. King; Frank D. Cimino (57) ABSTRACT

In at least one example, an apparatus includes a logic circuit having a switch control output and first and second logic circuit inputs. A pulse generator has a generator output coupled to the first logic circuit input. An elevated temperature detector has a detector output and a temperature sensor. The detector output is coupled between the second logic circuit input and the temperature sensor.

8 Claims, 4 Drawing Sheets

TEMPERATURE-SENSITIVE SAMPLING

BACKGROUND

Sample-and-hold circuits can be useful to reduce power consumption. A sample-and-hold circuit can transition between a sample state and a hold state. An input signal can be periodically switched to a hold element (e.g., a capacitor and/or an inductor) of the sample-and-hold circuit to facilitate sampling. In the sample state, the input signal can be coupled to the hold element for a period of time (sample interval). Electrical energy stored in the hold element can be useful to provide an output signal representative of the input signal during a hold interval that extends between successive sample intervals. An analog circuit providing the input signal can operate in a quiescent state (e.g., a standby state, a sleep state, and/or a hibernate state) during hold intervals to reduce power consumption.

SUMMARY

In at least one example, an apparatus includes a logic circuit having a switch control output and first and second logic circuit inputs. A pulse generator has a generator output coupled to the first logic circuit input. An elevated temperature detector has a detector output and a temperature sensor. The detector output is coupled between the second logic circuit input and the temperature sensor.

DETAILED DESCRIPTION

As described above, electrical energy stored in a hold element (e.g., a capacitor and/or an inductor) of a sample-and-hold circuit can be useful to provide an output signal representative of an input signal during a hold interval. An analog circuit providing the input signal can operate in a quiescent state (e.g., a standby state, a sleep state, and/or a hibernate state) during the hold interval to reduce power consumption. Leakage current in the sample-and-hold circuit during the hold interval can change a level of electrical energy stored in the hold element over time. As the level of stored electrical energy changes responsive to leakage current, a value of the output signal can deviate from a sampled value of the input signal during the hold interval. Leakage current can adversely affect accuracy of the output signal provided by the sample-and-hold circuit. A likelihood of erratic or abnormal output behavior by the sample-and-hold circuit can increase as leakage current in the sample-and-hold circuit increases responsive to temperature increases.

Some approaches may exist for mitigating erratic or abnormal output behavior by a sample-and-hold circuit as leakage current increases responsive to temperature increases. These approaches may also increase power consumption and/or component costs by introducing additional circuits to measure leakage current as an indicator of temperature. These approaches may also increase circuit complexity by implementing control techniques that involve controlling one or more operating parameters (e.g., sampling frequency or voltage ripple of the output signal) of the sample-and-hold circuit as a function of leakage current to mitigate leakage current-related effects.

Aspects of this description relate to a sample driver with elevated temperature detection to support temperature-sensitive sampling. In at least one example, the sample driver includes an elevated temperature detector configured to provide a mode selection signal ($V_{MODE}$). Temperature proximate to the sample driver, as measured by a temperature sensor of the elevated temperature sensor, controls a value of $V_{MODE}$. Providing the elevated temperature detector with the temperature sensor avoids introducing additional circuits to measure leakage current as an indicator of temperature. Component cost increases and/or power consumption increases associated with such additional circuits can be avoided. An operating mode of a sample-and-hold circuit can be controlled by the value of $V_{MODE}$. Controlling the operational mode of the sample-and-hold circuit with a single signal (e.g., $V_{MODE}$) can be useful to avoid increases in circuit complexity related to control techniques that involve controlling one or more operating parameters of the sample-and-hold circuit as a function of leakage current. In at least one example, a comparator of the elevated temperature detector provides $V_{MODE}$.

Figure 1:
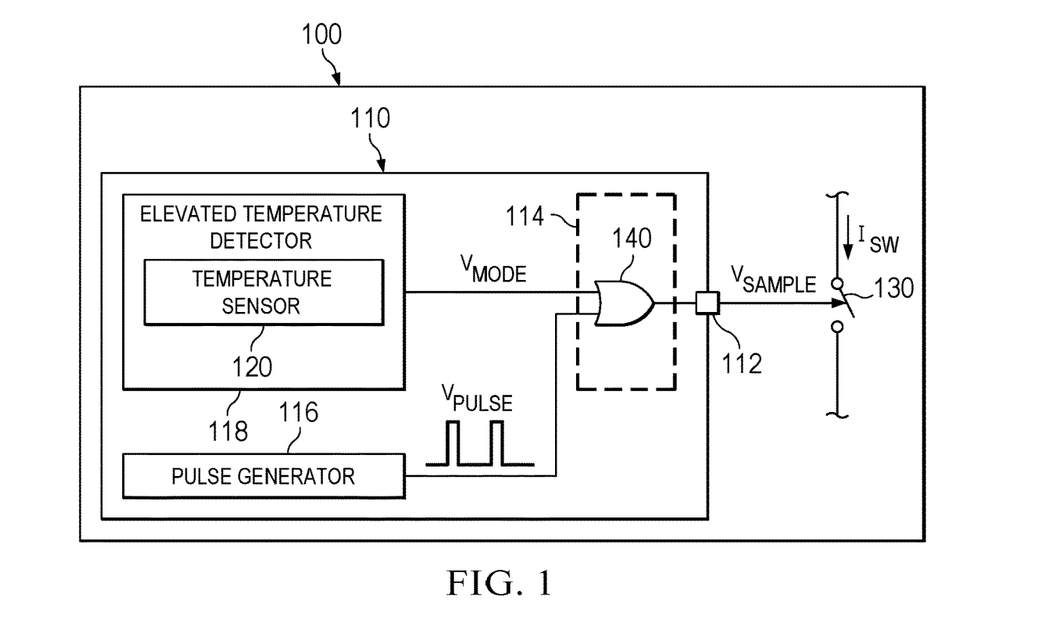
FIG. 1 is a block diagram of an example apparatus for reducing power consumption.

FIG. 1 is a block diagram of an example apparatus 100 for reducing power consumption. At least some implementations of the apparatus 100 are representative of an application environment for a sample driver with elevated temperature detection to support temperature-sensitive sampling. The apparatus 100 can include a sample driver 110 having a driver output 112, a logic circuit 114, a pulse generator 116, and an elevated temperature detector 118 with a temperature sensor 120. The driver output 112 is coupled to a control terminal (e.g., a gate) of a switch 130. In various examples, the switch 130 is a transistor or other switching device, such as a field-effect transistor (FET), a metal-oxide-semiconductor field-effect transistor (MOSFET), or a bipolar junction transistor (BJT). The sample driver 110 is configured to provide a sampling signal ($V_{SAMPLE}$) at the driver output 112 that controls a conductive state of the switch 130.

In an example architecture of the apparatus 100, a detector output of the elevated temperature detector 118 is coupled between a first logic circuit input of the logic circuit 114 and the temperature sensor 120. A generator output of the pulse generator 116 is coupled to a second logic circuit input of the logic circuit 114. A logic circuit output of the logic circuit 114 is coupled to the driver output 112. In at least one example, the logic circuit 114 includes a logic gate 140. The logic gate 140 can be an OR logic gate or otherwise provide the functionality of an OR logical operation.

In an example operation of the apparatus 100, the driver output 112 is configured to provide $V_{SAMPLE}$ at the control terminal of the switch 130. The switch 130 is configured to, responsive to the driver output 112 providing $V_{SAMPLE}$ having a first voltage level (e.g., a high-voltage level), activate (e.g., turn on). Responsive to the switch 130 being activated, a current ($I_{SW}$) flows through the switch 130 such that power consumption in the apparatus 100 increases. The switch 130 is configured to, responsive to the driver output 112 providing $V_{SAMPLE}$ having a second voltage level (e.g., a low-voltage level), deactivate (e.g., turn off). Responsive to the switch 130 being deactivated, $I_{SW}$ ceases to flow through the switch 130 such that power consumption in the apparatus 100 decreases.

In some examples, the apparatus 100 can operate from a limited power source (e.g., a battery). Reducing average power consumption in the apparatus 100 can be useful to extend an operating time of the limited power source. A pulse signal ($V_{PULSE}$) provided at the generator output of the pulse generator 116 can be useful to reduce average power consumption in the apparatus 100. $V_{PULSE}$ can periodically cycle between a first voltage level (e.g., a high-voltage level) and a second voltage level (e.g., a low-voltage level) to form voltage pulses. Voltage of $V_{PULSE}$ provided at the generator output of the pulse generator 116 can be provided to the control terminal of the switch 130 via the logic circuit 114. $V_{PULSE}$ can control the conductive state of the switch 130 responsive to a voltage of $V_{PULSE}$ provided to the control terminal of the switch 130 via the logic circuit 114.

Varying a frequency (e.g., a number of voltage pulses per unit of time) or a duty cycle (e.g., a duration of a voltage pulse relative to a duration of a cycle of $V_{PULSE}$) of $V_{PULSE}$ can control average power consumption in the apparatus 100 responsive to $V_{PULSE}$ controlling the conductive state of the switch 130. For example, responsive to $V_{PULSE}$ controlling the conductive state of the switch 130, increasing the frequency of $V_{PULSE}$ can activate the switch 130 more frequently such that average power consumption in the apparatus 100 increases. Alternatively, responsive to $V_{PULSE}$ controlling the conductive state of the switch 130, decreasing the frequency of $V_{PULSE}$ can activate the switch 130 less frequently such that average power consumption in the apparatus 100 decreases. As another example, responsive to $V_{PULSE}$ controlling the conductive state of the switch 130, increasing the duty cycle of $V_{PULSE}$ can activate the switch 130 for a longer period of time such that average power consumption in the apparatus 100 increases. Alternatively, responsive to $V_{PULSE}$ controlling the conductive state of the switch 130, decreasing the duty cycle of $V_{PULSE}$ can activate the switch 130 for a shorter period of time such that average power consumption in the apparatus 100 decreases.

Figure 2:
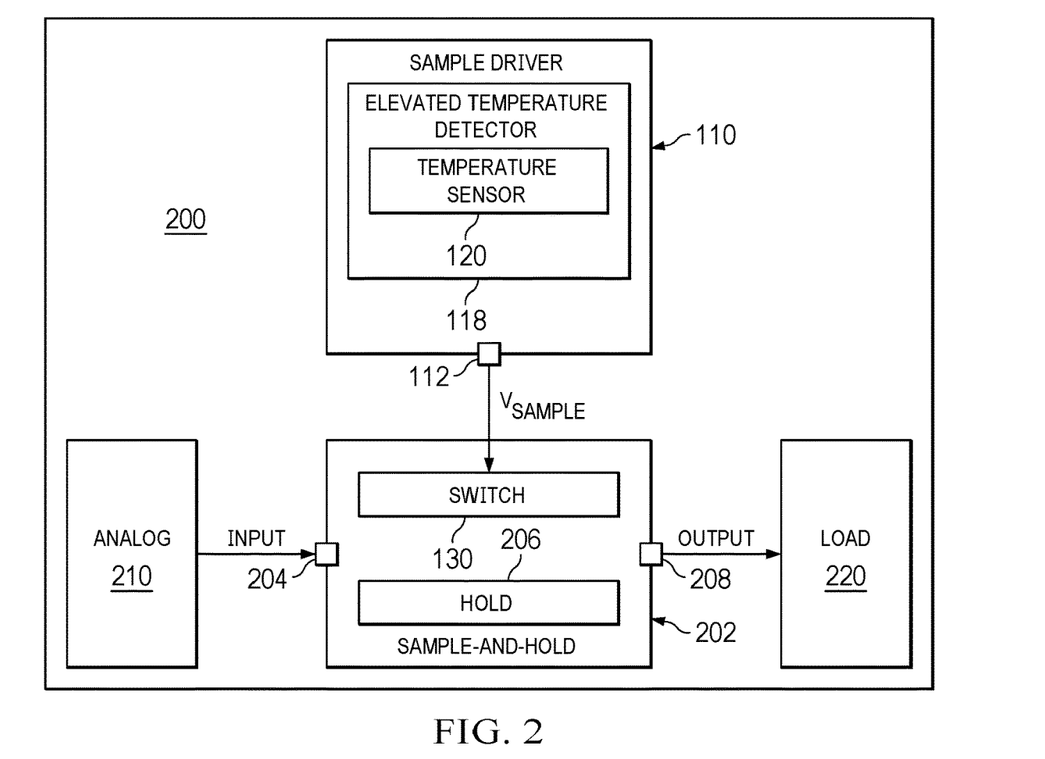
FIG. 2 is a block diagram of an example apparatus for reducing power consumption.

Reducing average power consumption can be among a number of design considerations where trade-offs exist between different design considerations. FIG. 2 is a block diagram of an apparatus 200 for reducing power consumption, in accordance with various examples. In some examples, the apparatus 200 can operate from a limited power source (e.g., a battery). Reducing average power consumption in the apparatus 200 can be useful to extend an operating time of the limited power source. The apparatus 200 represents an implementation in which trade-offs exist between reducing power consumption and other design considerations, in accordance with various examples. The apparatus 200 includes the sample driver 110 with the driver output 112 configured to provide $V_{SAMPLE}$ at the control terminal of the switch 130. The apparatus 200 also includes a sample-and-hold circuit 202 with the switch 130, a reference input 204, a hold element 206, and a reference output 208.

In an example architecture, the reference input 204 and the reference output 208 are coupled to an analog circuit 210 and a load circuit 220, respectively. The switch 130 is coupled between the reference input 204 and the hold element 206. The hold element 206 is coupled between the switch 130 and the reference output 208. The analog circuit 210 is configured to provide an input signal (e.g., a voltage input signal and/or a current input signal) at the reference input 204 while the analog circuit 210 operates in an active state. In at least one example, the input signal provided at the reference input 204 can be a voltage reference (e.g., a substantially static input signal). In at least one example, the analog circuit 210 can be a voltage reference circuit that is configured to provide a voltage reference at the reference input 204 that can be useful to a switching converter. In at least one example, the input signal provided at the reference input 204 can be a time-varying input signal. In at least one example, the analog circuit 210 can be a sensor device (e.g., a tire pressure sensor) that is configured to provide a time-varying input signal at the reference input 204 that can be useful to a controller or a processor. The hold element 206 is configured to store electrical energy corresponding to the input signal provided at the reference input 204. The sample-and-hold circuit 202 is configured to, responsive to electrical energy provided by the hold element 206, provide an output signal at the reference output 208 that modifies operation of the load circuit 220.

In the apparatus 200, the conductive state of the switch 130 can control operation of the sample-and-hold circuit 202. Accordingly, $V_{SAMPLE}$ provided at the driver output 112 of the sample driver 110 can be useful to control operation of the sample-and-hold circuit 202. For example, the sample driver 110 can trigger a sample-to-hold transition by decreasing $V_{SAMPLE}$ provided at the driver output 112 from a first voltage level (e.g., a high-voltage level) to a second voltage level (e.g., a low-voltage level). The sample-to-hold transition can involve the sample-and-hold circuit 202 transitioning from a sample state to a hold state. As another example, the sample driver 110 can trigger a hold-to-sample transition by increasing $V_{SAMPLE}$ provided at the driver output 112 from the second voltage level to the first voltage level. The hold-to-sample transition can involve the sample-and-hold circuit 202 transitioning from the hold state to the sample state.

While the sample-and-hold circuit 202 operates in the sample state, the switch 130 provides a conductive path between the reference input 204 and the hold element 206 for a period of time (sample interval). The conductive path provided by the switch 130 can facilitate electrical energy transfer between the reference input 204 and the hold element 206. The conductive path provided by the switch 130 can increase power consumption in the apparatus 200. The apparatus 200 can operate the analog circuit 210 in the active state during the sample interval to provide the input signal at the reference input 204. Power consumption in the apparatus 200 can also increase responsive to an increase in current consumption by the analog circuit 210 related to providing the input signal at the reference input 204.

While the sample-and-hold circuit 202 operates in the hold state, the switch 130 ceases to provide the conductive path between the reference input 204 and the hold element 206 for a period of time (hold interval). Absence of the conductive path provided by the switch 130 can reduce (e.g., eliminate) electrical energy transfer between the reference input 204 and the hold element 206. Absence of the conductive path provided by the switch 130 can reduce power consumption in the apparatus 200. A reduction of current consumption by the analog circuit 210 operating in a quiescent state (e.g., a standby state, a sleep state, and/or a hibernate state) during hold intervals can also reduce power consumption in the apparatus 200. Extending hold intervals and/or shortening sample intervals can be useful to reduce average power consumption in the apparatus 200 to the extent that power consumption decreases during hold intervals and increases during sample intervals.

A level of electrical energy stored in the hold element 206 can control a value of the output signal provided at the reference output 208. Leakage current in the sample-and-hold circuit 202 can change a level of electrical energy stored in the hold element 206 during hold intervals. A value of the output signal provided at the reference output 208 can deviate from a sampled value of the input signal during hold intervals responsive to leakage current-related changes in the level of electrical energy stored in the hold element 206. Deviation between a value of the output signal provided at the reference output 208 and a sampled value of the input signal provided at the reference input 204 can represent hold error. Hold error can be directly related to hold interval duration, such that hold error can increase responsive to extending hold intervals and decrease responsive to shortening hold intervals. While useful for reducing average power consumption in the apparatus 200, extending hold intervals can increase hold error in the apparatus 200. Accordingly, trade-offs may exist between reducing power consumption and reducing hold error in the apparatus 200.

Different operational modes of the sample-and-hold circuit 202 can be useful to manage such trade-offs in a manner that balances different design considerations (e.g., power consumption and/or hold error). The different operational modes can include a pulsed mode where the sample-and-hold circuit 202 periodically cycles between the sample state and the hold state. Voltage of $V_{SAMPLE}$ provided at the driver output 112 can vary to facilitate periodically cycling the sample-and-hold circuit 202 between the sample state and the hold state. In at least one example, the voltage of $V_{SAMPLE}$ provided at the driver output 112 can, responsive to the operational mode of the sample-and-hold circuit 202 being the pulsed mode, correspond to $V_{PULSE}$ provided by the pulse generator 116 of the sample driver 110. While the operational mode is the pulsed mode, the sample driver 110 can periodically trigger state transitions (e.g., a sample-to-hold transition and/or a hold-to-sample transition) in the sample-to-hold circuit 202 by varying the voltage of $V_{SAMPLE}$, as described above.

Varying latency between different state transitions can be useful to control power consumption and/or hold error in the apparatus 200. Varying a frequency and/or a duty cycle of $V_{PULSE}$ provided by the pulse generator 116 of the sample driver 110 can facilitate varying latency between different state transitions. Increasing latency between successive sample-to-hold transitions can increase a sampling frequency (e.g., a number of sample intervals per unit of time) of the sample-and-hold circuit 202. Power consumption and hold error in the apparatus 200 can increase and decrease, respectively, responsive to increasing the sampling frequency of the sample-and-hold circuit 202. Decreasing latency between successive sample-to-hold transitions can decrease the sampling frequency of the sample-and-hold circuit 202. Power consumption and hold error in the apparatus 200 can decrease and increase, respectively, responsive to decreasing the sampling frequency of the sample-and-hold circuit 202.

Increasing latency between a sample-to-hold transition and a hold-to-sample transition succeeding the sample-to-hold transition can decrease a sampling duty cycle (e.g., a sample interval duration relative to a corresponding hold interval duration) of the sample-and-hold circuit 202. Power consumption and hold error in the apparatus 200 can decrease and increase, respectively, responsive to decreasing the sampling duty cycle of the sample-and-hold circuit 202. Decreasing latency between a sample-to-hold transition and a hold-to-sample transition succeeding the sample-to-hold transition can increase the sampling duty cycle of the sample-and-hold circuit 202. Power consumption and hold error in the apparatus 200 can increase and decrease, respectively, responsive to increasing the sampling duty cycle of the sample-and-hold circuit 202.

The different operational modes of the sample-and-hold circuit 202 can also include a continuous mode. In the continuous mode, the sample-and-hold circuit 202 continuously operates in the sample state. Voltage of $V_{SAMPLE}$ provided at the driver output 112 can, responsive to the operational mode of the sample-and-hold circuit 202 being the continuous mode, remain at about a first voltage level (e.g., a high-voltage level). While the operational mode is the continuous mode, the sample driver 110 controls the conductive state of the switch 130 to remain active such that the switch 130 continuously provides a conductive path between the reference input 204 and the hold element 206. Power consumption and hold error in the apparatus 200 can increase and decrease, respectively, responsive to the switch 130 continuously providing the conductive path between the reference input 204 and the hold element 206.

Leakage current in the sample-and-hold circuit 202 can increase responsive to temperature increases. As temperature increases, leakage current in the sample-and-hold circuit 202 can increase at a non-linear rate (e.g., a 10-degree Celsius (° C.) increase in temperature can increase leakage current by a factor of about 10). For example, leakage current in the sample-and-hold circuit 202 can increase from femtoamps to microamps or milliamps responsive to temperature increasing from 25° C. to 125° C. Increasing at a non-linear rate with respect to temperature, leakage current in the sample-and-hold circuit 202 can exceed an operating current (e.g., current consumed by the analog circuit 210 operating in the active state) of the analog circuit 210, as temperature increases.

Elevated temperature (e.g., about 130° C.) proximate the apparatus 200 can be indicative of an elevated temperature event. In the context of automotive electronics, an elevated temperature event can correspond to temperature increasing responsive to operation of an engine and related electronics. In the context of portable electronics, an elevated temperature event can correspond to temperature increasing responsive to self-heating from operating electronics. Operating current of the analog circuit 210 can exceed leakage current in the sample-and-hold circuit 202 during an elevated temperature event. Power efficiency gains related to operating the analog circuit 210 in a quiescent state are vitiated responsive to operating current of the analog circuit 210 exceeding leakage current in the sample-and-hold circuit 202. Responsive to leakage current, electrical energy stored in the hold element 206 can decay at an increasing rate during an elevated temperature event thereby increasing hold error. A likelihood of erratic or abnormal output behavior by the sample-and-hold circuit 202 can increase during an elevated temperature event responsive to increasing hold error. The elevated temperature detector 118 of the sample driver 110 can be useful to mitigate adverse effects related to an elevated temperature event.

With reference to FIG. 1, the temperature sensor 120 of the elevated temperature detector 118 is configured to provide $V_{TEMP}$. A value of $V_{TEMP}$ can be indicative of temperature proximate to the apparatus 100, as measured by the temperature sensor 120. In at least one example, temperature sensor 120 is configured to provide $V_{TEMP}$ without regard to leakage current. The elevated temperature detector 118 is configured to, responsive to $V_{TEMP}$ and a reference voltage ($V_{REF}$), provide a mode selection signal ($V_{MODE}$) at the detector output. In at least one example, a value of $V_{REF}$ is determined based on a programmed value for leakage current in a sample-and-hold circuit (e.g., sample-and-hold circuit 202 of FIG. 2) and/or a programmed value for an operating current of an analog circuit (e.g., analog circuit 210 of FIG. 2). In at least one example, a value of $V_{REF}$ represents a threshold temperature at which the leakage current in the sample-and-hold circuit exceeds the operating current of the reference circuit.

$V_{MODE}$ having a first voltage level (e.g., a high-voltage level) is provided at the detector output of the elevated temperature detector 118 responsive to $V_{TEMP}$ and $V_{REF}$ being indicative of an elevated temperature event. Otherwise, $V_{MODE}$ having a second voltage level (e.g., a low-voltage level) is provided at the detector output of the elevated temperature detector 118. The first voltage level and the second voltage level can represent an asserted value and a deasserted value of $V_{MODE}$, respectively. A voltage of $V_{SAMPLE}$ provided at the driver output 112 corresponds to a voltage of $V_{MODE}$ responsive to $V_{MODE}$ having the asserted value. A voltage of $V_{SAMPLE}$ provided at the driver output 112 corresponds to a voltage of $V_{PULSE}$ provided at the generator output of the pulse generator 116 responsive to $V_{MODE}$ having the deasserted value. Inasmuch as a value of $V_{MODE}$ provided at the detector output of the elevated temperature detector 118 controls a voltage of $V_{SAMPLE}$ provided at the driver output 112, the value of $V_{MODE}$ can be useful to control the conductive state of the switch 130.

Figure 3:
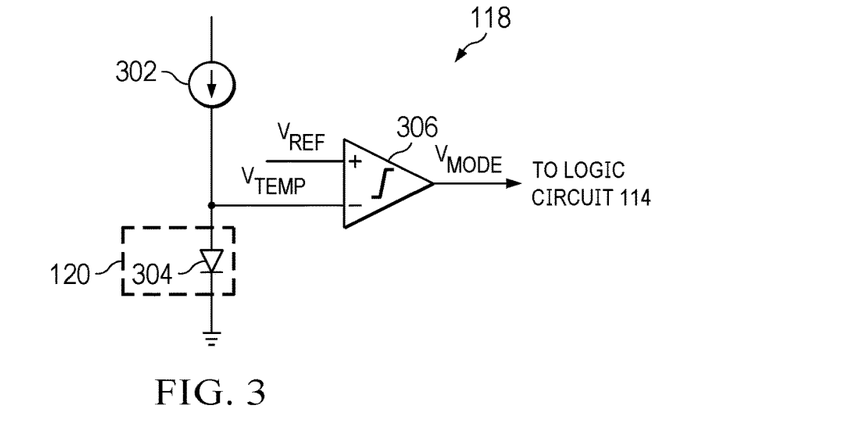
FIG. 3 is a schematic diagram of an example implementation of the elevated temperature detector.

FIG. 3 is a schematic diagram of an example implementation of the elevated temperature detector 118. In at least some examples, the elevated temperature detector 118 can include a current source 302, a diode 304, and a comparator 306. In an example architecture of the elevated temperature detector 118, an anode of the diode 304 can be coupled to the current source 302 and a first comparator input (e.g., a negative or inverting input) of the comparator 306. A cathode of the diode 304 can be coupled to ground. A second comparator input (e.g., a positive or non-inverting input) of the comparator 306 can be coupled to $V_{REF}$. In this example architecture, the diode 304 can represent the temperature sensor 120 of the elevated temperature detector 118. The comparator 306 can be coupled between the diode 304 (representing the temperature sensor 120) and a detector output of the elevated temperature detector 118.

In an example operation of the elevated temperature detector 118, the current source 302 can be configured to sink current to ground to bias the diode 304. The diode 304 can be configured to, responsive to the current provided by the current source 302, provide $V_{TEMP}$ to the second comparator input of the comparator 306. A value of $V_{TEMP}$ provided by the diode 304 can vary responsive to variations in a voltage drop ($V_F$) across the diode 304 under a biased condition. A value of $V_F$ across the diode 304 under a biased condition can be directly related to a value of a resistance ($R_F$) between the anode and cathode of the diode 304 under the biased condition. A value of $R_F$ for the diode 304 under a biased condition can be inversely related to temperature. Accordingly, a value of $V_{TEMP}$ provided by the diode 304 can be inversely related to temperature. For example, a value of $V_{TEMP}$ provided by the diode 304 can decrease responsive to increasing temperature and increase responsive to decreasing temperature. In this example, those variations in the value of $V_{TEMP}$ can track analogous variations in the respective values for $R_F$ and $V_F$ of the diode 304 under a biased condition. The comparator 306 can be configured to, responsive to a voltage difference between $V_{TEMP}$ and $V_{REF}$ (e.g., $V_{TEMP} V_{REF}$), provide $V_{MODE}$.

Figure 4:
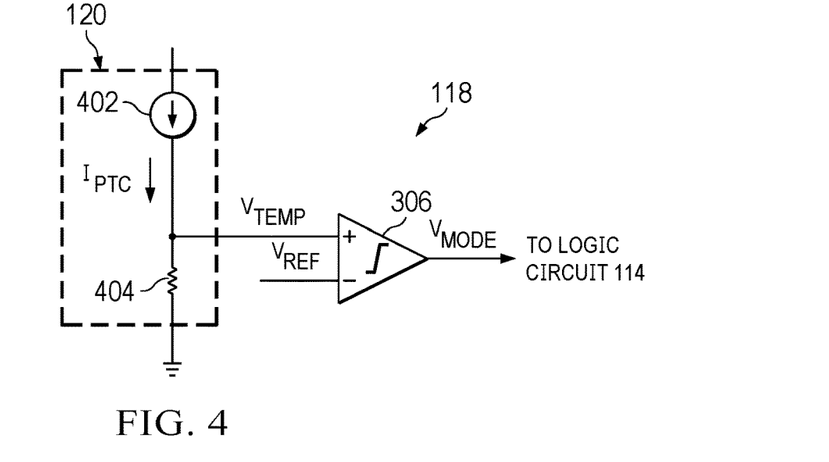
FIG. 4 is a schematic diagram of an example implementation of the elevated temperature detector.

FIG. 4 is a schematic diagram of an example implementation of the elevated temperature detector 118. In at least some examples, the elevated temperature detector 118 can include a proportional to absolute temperature (PTAT) current source 402, a resistor 404, and the comparator 306. In an example architecture of the elevated temperature detector 118, a first terminal of the resistor 404 can be coupled to the PTAT current source 402 and the second comparator input (e.g., a positive or non-inverting input) of the comparator 306. A second terminal of the resistor 404 can be coupled to ground. The first comparator input (e.g., a negative or inverting input) of the comparator 306 can be coupled to $V_{REF}$. In this example architecture, the PTAT current source 402 and the resistor 404 can represent the temperature sensor 120 of the elevated temperature detector 118. The comparator 306 can be coupled between the PTAT current source 402 and the resistor 404 (representing the temperature sensor 120) and a detector output of the elevated temperature detector 118.

In an example operation of the elevated temperature detector 118, the PTAT current source 402 can be configured to provide a current ($I_{PTC}$) having a positive temperature coefficient (PTC). The resistor 404 can be configured to, responsive to $I_{PTC}$ provided by the PTAT current source 402, provide $V_{TEMP}$ to the second comparator input of the comparator 306. A value of $V_{TEMP}$ provided by the resistor 404 can vary responsive to variations in $I_{PTC}$ provided by the PTAT current source 402. Accordingly, a value of $V_{TEMP}$ provided by the resistor 404 can be directly related to temperature. For example, the value of $V_{TEMP}$ provided by the resistor 404 can increase responsive to increasing temperature and decrease responsive to decreasing temperature. The comparator 306 can be configured to, responsive to a voltage difference between $V_{TEMP}$ and $V_{REF}$ (e.g., $V_{TEMP}-V_{REF}$), provide $V_{MODE}$.

Figure 5:
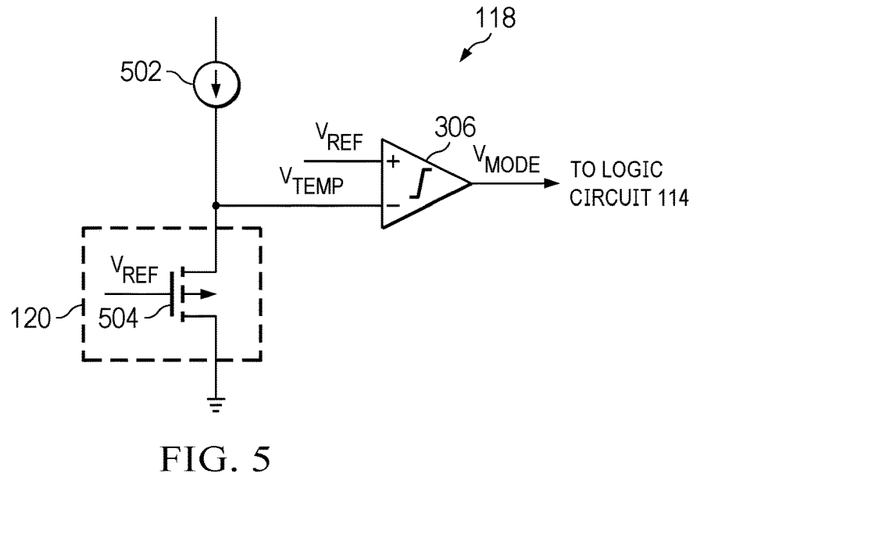
FIG. 5 is a schematic diagram of an example implementation of the elevated temperature detector.

FIG. 5 is a schematic diagram of an example implementation of the elevated temperature detector 118. In at least some examples, the elevated temperature detector 118 can include the comparator 306, a current source 502, and a transistor 504 or other switching device, such as a field-effect transistor (FET), a metal-oxide-semiconductor field-effect transistor (MOSFET), or a bipolar junction transistor (BJT). In at least one example, the transistor 629 can represent an enhancement type MOSFET. The current source 502 can be configured to sink current to ground to provide biasing current for the transistor 504. In an example architecture of the elevated temperature detector 118, a gate and a first terminal (e.g., a source) of the transistor 504 can be coupled to $V_{REF}$ and ground, respectively. A second terminal (e.g., a drain) of the transistor 504 can be coupled to the current source 502 and the first comparator input (e.g., a negative or inverting input). The second comparator input (e.g., a positive or non-inverting input) of the comparator 306 can be coupled to $V_{REF}$. In this example architecture, the transistor 504 can represent the temperature sensor 120 of the elevated temperature detector 118. The comparator 306 can be coupled between the transistor 504 representing the temperature sensor and a detector output of the elevated temperature detector 118. In at least one example, the transistor 504 can be configured to operate in a subthreshold region (e.g., in weak inversion).

In an example operation of the elevated temperature detector 118, $V_{REF}$ can be provided to the gate of the transistor 504. The transistor 504 can be configured to, responsive to providing $V_{REF}$ to the gate of the transistor 504, provide $V_{TEMP}$ to the first comparator input of the comparator 306. A value of $V_{TEMP}$ provided by the transistor 504 can vary responsive to a conductive state of the transistor 504. A value of $V_{REF}$ relative to a threshold voltage ($V_{TH}$) of the transistor 504 can control a conductive state of the transistor 504. In at least one example, the transistor 504 is configured to operate in a subthreshold region. In this example, controlling the conductive state of the transistor 504 can involve variation in a gate-source voltage ($V_{GS(on)}$) of the transistor 504. Responsive to $V_{REF}$ exceeding $V_{TH}$, the transistor 504 can be configured to become conductive (e.g., active) such that current conducts between the first and second terminals of transistor 504. Responsive to $V_{TH}$ exceeding $V_{REF}$, the transistor 504 can be configured to become non-conductive (e.g., inactive) such that current conduction can be absent between the first and second terminals of transistor 504.

A value of $V_{TH}$ can be inversely related to temperature, such that the value of $V_{TH}$ can decrease responsive to increasing temperature and increase responsive to decreasing temperature. A particular value of $V_{REF}$ can correspond to different conductive states of the transistor 504 at different temperatures. For example, a particular value of $V_{REF}$ can cause the transistor 504 to become conductive at a first temperature can also cause the transistor 504 to become non-conductive at a second temperature below the first temperature, responsive to variations in the value of $V_{TH}$. Accordingly, $V_{TH}$ of the transistor 504 can be useful to provide $V_{TEMP}$ to the first comparator input of the comparator 306 with a value indicative of temperature. The comparator 306 can be configured to, responsive to a voltage difference between $V_{REF}$ and $V_{TEMP}$ (e.g., $V_{REF}$–$V_{TEMP}$), provide $V_{MODE}$.

Figure 6:
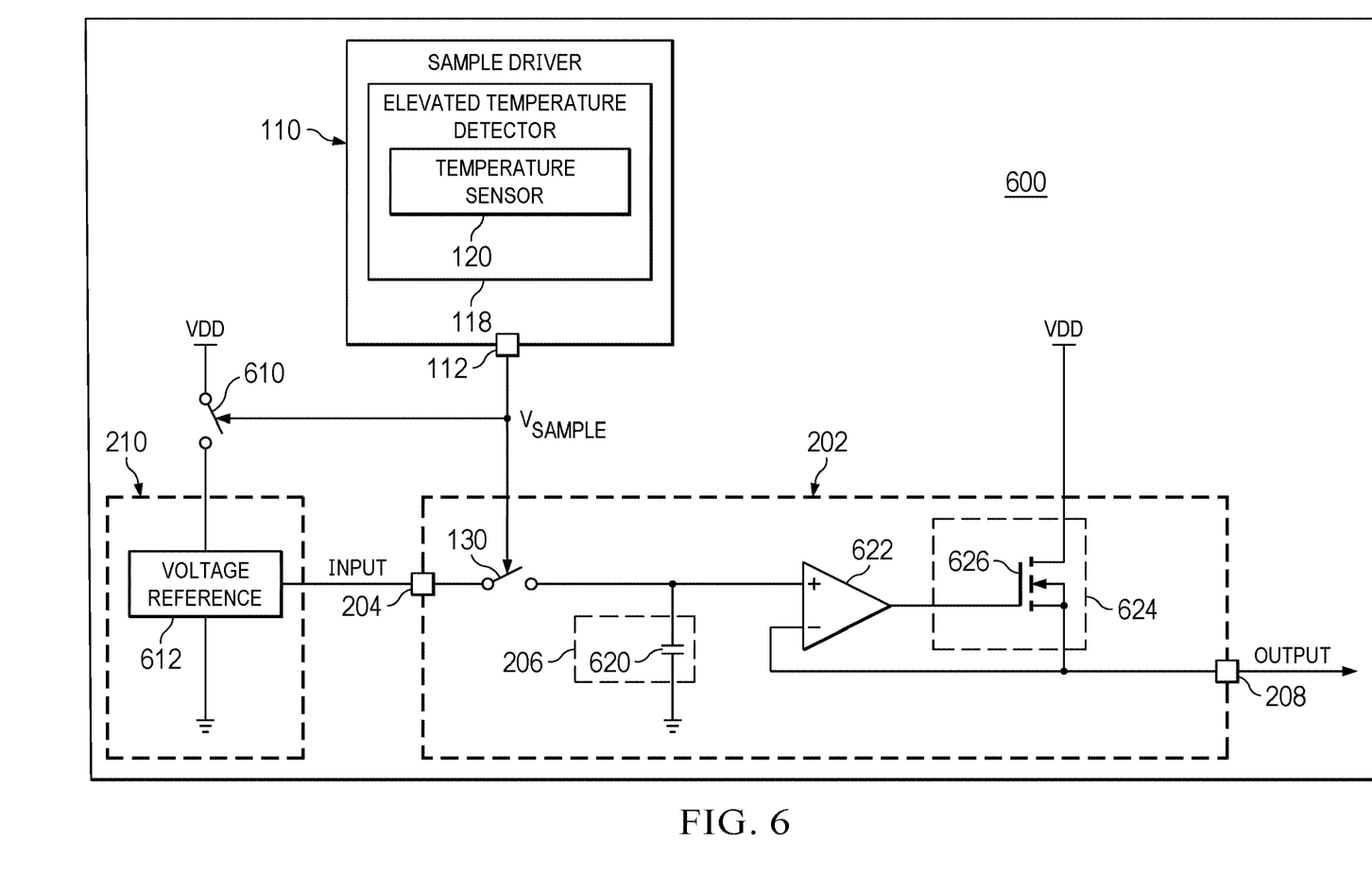
FIG. 6 is a block diagram of an example apparatus for reducing power consumption.

FIG. 6 is a block diagram of an apparatus 600 for reducing power consumption, in accordance with various examples. In some examples, the apparatus 600 can operate from a limited power source (e.g., a battery). Reducing average power consumption in the apparatus 600 can be useful to extend an operating time of the limited power source. The apparatus 600 includes the sample driver 110, the sample-and-hold circuit 202, and the analog circuit 210. The apparatus 600 also includes a switch 610 having a control terminal. In various examples, the switch 610 is a transistor or other switching device, such as a FET, a MOSFET, or a BJT. The control terminal of the switch 610 is coupled to the driver output 112 of the sample driver 110. The switch 610 is coupled between a voltage supply ($V_{DD}$) and the analog circuit 210. In at least one example, $V_{DD}$ is provided by the limited power source. The apparatus 600 represents an implementation in which a value of $V_{MODE}$ provided at the detector output of the elevated temperature detector 118 controls operation of both the sample-and-hold circuit 202 and the analog circuit 210, in accordance with various examples.

In apparatus 600, the analog circuit 210 includes an analog voltage circuit 612 and the hold element 206 of the sample-and-hold circuit 202 includes a capacitive hold element 620 to facilitate temperature-sensitive sampling in a voltage configuration. The analog voltage circuit 612 is configured to provide a voltage input signal (e.g., time-varying voltage input signal or a substantially static voltage input signal) at the reference input 204 while the analog circuit 210 operates in an active state. The capacitive hold element 620 is configured to store electrical energy in an electrical field that corresponds to the input signal provided at the reference input 204. Although not shown in FIG. 6, the analog circuit 210 can include an analog current circuit, and the hold element 206 of the sample-and-hold circuit 202 can include an inductive hold element, to facilitate temperature-sensitive sampling in a current configuration.

The sample-and-hold circuit 202 of the apparatus 600 also includes an amplifier (e.g., an error amplifier) 622 and a power stage 624 with a transistor 626. In at least one example, the transistor 626 is an enhancement-type MOSFET. The amplifier 622 and the power stage 624 represent devices of the sample-and-hold circuit 202 that continue to operate during hold intervals without increasing average power consumption in the apparatus 600. For example, the amplifier 622 and the power stage 624 continue to operate during hold intervals to facilitate providing the output signal at the reference output 208 without drawing current from $V_{DD}$ or the hold element 206.

As described above, a value of $V_{MODE}$ provided at the detector output of the elevated temperature detector 118 controls a voltage of $V_{SAMPLE}$ provided at the driver output 112. Absent $V_{TEMP}$ and $V_{REF}$ being indicative of an elevated temperature event, a conductive state of the switch 130 and a conductive state of the switch 610 are unimpacted by operation of the elevated temperature detector 118 in that the value of $V_{MODE}$ remains a deasserted value (e.g., a low-voltage level). A voltage of $V_{SAMPLE}$ provided at the driver output 112 corresponds to $V_{PULSE}$ provided at the generator output of the pulse generator 116 responsive to $V_{MODE}$ having the deasserted value. Responsive to the voltage of $V_{SAMPLE}$ corresponding to $V_{PULSE}$, voltage of $V_{PULSE}$ is provided to the respective control terminals of both the switch 130 and the switch 610. $V_{PULSE}$ controls both the conductive state of the switch 130 and the conductive state of the switch 610 while the value of $V_{MODE}$ remains the deasserted value. Controlling the conductive state of the switch 130 with $V_{PULSE}$ while the value of $V_{MODE}$ remains the deasserted value can involve periodically cycling the sample-and-hold circuit 202 between a sample state and a hold state. Accordingly, an operational mode of the sample-and-hold circuit 202 is a pulsed mode while the value of $V_{MODE}$ remains the deasserted value.

Controlling the conductive state of the switch 610 with $V_{PULSE}$ while the value of $V_{MODE}$ remains the deasserted value can involve periodically cycling the analog circuit 210 between an active state and a quiescent state. To that end, a conductive path between $V_{DD}$ and the analog circuit 210 provided by the switch 610 is controlled by $V_{PULSE}$ while the value of $V_{MODE}$ remains the deasserted value. The analog circuit 210 is configured to, responsive to $V_{PULSE}$ controlling the conductive state of the switch 610 to be active and to provide the conductive path between $V_{DD}$ and the analog circuit 210, operate in the active state. The analog circuit 210 is configured to, responsive to $V_{PULSE}$ controlling the conductive state of the switch 610 to be inactive and to cease providing the conductive path between $V_{DD}$ and the analog circuit 210, operate in the quiescent state.

The elevated temperature detector 118 is configured to monitor for elevated temperature events based on $V_{TEMP}$ and $V_{REF}$. Responsive to $V_{TEMP}$ and $V_{REF}$ being indicative of an elevated temperature event, the value of $V_{MODE}$ transitions from the deasserted value to an asserted value (e.g., a high-voltage level) by operation of the elevated temperature detector 118. A voltage of $V_{SAMPLE}$ provided at the driver output 112 corresponds to $V_{MODE}$ responsive to $V_{MODE}$ having the asserted value (e.g., a high-voltage level). Responsive to the voltage of $V_{SAMPLE}$ corresponding to $V_{MODE}$, voltage of $V_{MODE}$ is provided to the respective control terminals of both the switch 130 and the switch 610. $V_{MODE}$ controls both the conductive state of the switch 130 and the conductive state of the switch 610 while the value of $V_{MODE}$ remains the asserted value. While the value of $V_{MODE}$ remains the asserted value, $V_{MODE}$ controls the switch 130 to continuously provide a conductive path between the reference input 204 and the hold element 206. Accordingly, the operational mode of the sample-and-hold circuit 202 is configured to, responsive to $V_{MODE}$ transitioning from the deasserted value to the asserted value, transition the pulsed mode to the continuous mode. While the value of $V_{MODE}$ remains the asserted value, $V_{MODE}$ controls the switch 610 to continuously provide a conductive path between $V_{DD}$ and the analog circuit 210. Responsive to the switch 610 continuously providing the conductive path, $V_{DD}$ continuously provides power to the analog circuit 210 such that the quiescent state of the analog circuit 210 is disabled responsive to $V_{MODE}$ having the asserted value.

Figure 7:
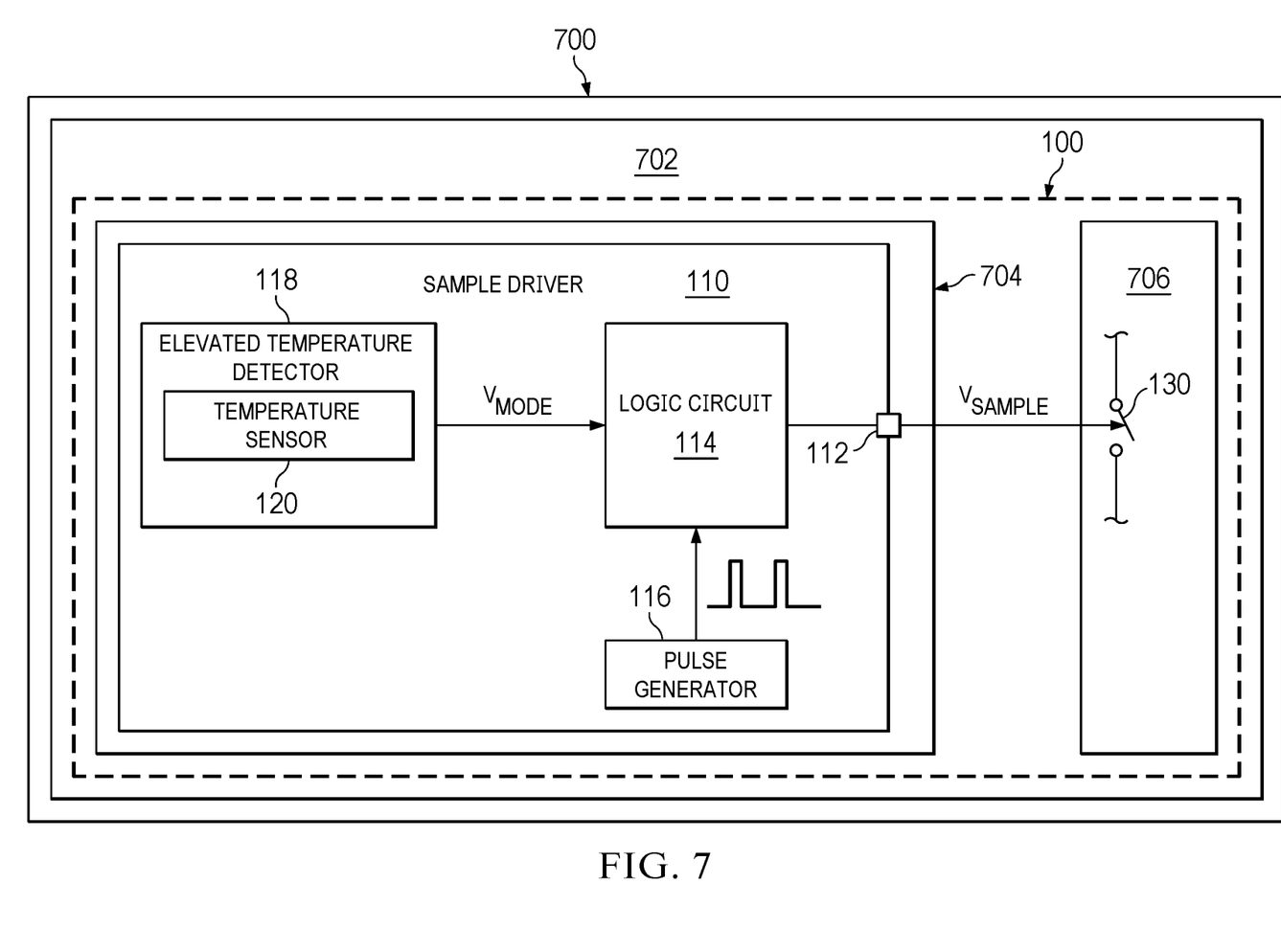
FIG. 7 is a block diagram of an example system that includes the apparatus for reducing power consumption.

FIG. 7 is a block diagram of an example system 700 that includes the apparatus 100 for reducing power consumption. At least some implementations of the system 700 are representative of application environments for the apparatus 100, such as an automobile, an appliance, a personal electronic device, or other application environments that implement a sample driver with elevated temperature detection to support temperature-sensitive sampling. In at least some examples, the system 700 includes a printed circuit board 702 having a first semiconductor package 704 and a second semiconductor package 706. The printed circuit board 702 may include one or more conductors (e.g., traces) that couple the sample driver 110, the switch 130, the first semiconductor package 704, and/or the second semiconductor package 706. The first semiconductor package 704 and the second semiconductor package 706 can each include one or more discrete semiconductor devices or integrated circuits that implement the sample driver 110 and the switch 130, respectively.

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components and forming the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources and forming the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An apparatus, comprising:
a logic circuit having a switch control output and first and second logic circuit inputs, wherein the switch control output is configured to be coupled to a control terminal of a switch, and the logic circuit is configured to provide a switch control signal at the switch control output that selects between a sample-and-hold operation mode and a continuous operation mode;
a pulse generator having a generator output coupled to the first logic circuit input; and
an elevated temperature detector having a detector output and a temperature sensor, wherein the detector output is coupled between the second logic circuit input and the temperature sensor.

2. The apparatus of claim 1, wherein the elevated temperature detector includes a comparator coupled between the detector output and the temperature sensor.

3. The apparatus of claim 1, wherein the temperature sensor includes a proportional to absolute temperature (PTAT) current source.

4. The apparatus of claim 1, wherein the temperature sensor includes a diode having a cathode coupled to a ground terminal.

5. The apparatus of claim 1, wherein the temperature sensor includes a field-effect transistor (FET) having a gate coupled to a reference voltage terminal.

6. The apparatus of claim 5, wherein the elevated temperature detector includes a comparator having a first comparator input and a second comparator input, the first comparator input coupled to the FET, and the second comparator input coupled to the reference voltage terminal.

7. The apparatus of claim 1, further comprising:
a first switch coupled between a reference input and a hold element, the first switch having a first control terminal coupled to the switch control output;
an analog circuit coupled to the reference input; and
a second switch coupled between the analog circuit and a voltage supply terminal, the second switch having a second control terminal coupled to the switch control output.

8. The apparatus of claim 1, further comprising a sample-and-hold circuit having a reference input, the sample-and-hold circuit including a switch and a hold element, the switch coupled between the hold element and the reference input.

\* \* \* \* \*